(12) United States Patent
Jo et al.

(10) Patent No.: US 11,889,714 B2
(45) Date of Patent: Jan. 30, 2024

(54) DISPLAY APPARATUS HAVING SUBSTRATE HOLE

(71) Applicant: LG DISPLAY CO., LTD., Seoul (KR)

(72) Inventors: Daegyu Jo, Goyang-si (KR); SungGyu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 156 days.

(21) Appl. No.: 16/902,742

(22) Filed: Jun. 16, 2020

(65) Prior Publication Data

US 2021/0143365 A1 May 13, 2021

(30) Foreign Application Priority Data

Nov. 8, 2019 (KR) .................. 10-2019-0142380

(51) Int. Cl.
*H10K 50/844* (2023.01)
*H10K 59/124* (2023.01)

(52) U.S. Cl.
CPC ......... *H10K 50/844* (2023.02); *H10K 59/124* (2023.02)

(58) Field of Classification Search
CPC ............ H01L 51/5256; H01L 51/5253; H01L 27/3246; H01L 27/3258; H10K 59/124; H10K 59/122; H10K 50/844; H10K 50/8445
See application file for complete search history.

(56) References Cited

U.S. PATENT DOCUMENTS

| 2017/0033312 A1* | 2/2017 | Kim ............... H10K 59/131 |
| 2018/0183015 A1 | 6/2018 | Yun et al. |
| 2019/0074479 A1 | 3/2019 | Lee et al. |
| 2020/0127231 A1 | 4/2020 | Yun et al. |
| 2020/0168671 A1* | 5/2020 | Jang ............. G06F 3/0412 |
| 2020/0312933 A1* | 10/2020 | Lee ................ H10K 59/00 |
| 2020/0365672 A1* | 11/2020 | Choi ............ H10K 59/1216 |

FOREIGN PATENT DOCUMENTS

| CN | 107039493 A | 8/2017 |
| CN | 109786427 A | 5/2019 |
| CN | 110164920 A | 8/2019 |
| CN | 110364560 A | 10/2019 |
| JP | 2017-199875 A | 11/2017 |
| JP | 2019-140097 A | 8/2019 |
| TW | 201801302 A | 1/2018 |

\* cited by examiner

*Primary Examiner* — Vongsavanh Sengdara
(74) *Attorney, Agent, or Firm* — Birch, Stewart, Kolasch & Birch, LLP

(57) ABSTRACT

The present disclosure discloses a display apparatus, including a substrate including a pixel area including a disconnected area which encloses a hole area, an organic light emitting diode formed in the pixel area and the disconnected area, a plurality of inorganic insulating layers disposed below the organic light emitting diode, a disconnection structure which is disposed in the disconnected area and encloses the hole area, and an internal dam which is disposed in the disconnected area and encloses the disconnection structure, and in which the disconnection structure includes an eave portion which is simultaneously formed with the internal dam and a trench which is formed by etching the plurality of inorganic insulating layers disposed below the eave portion, and the disconnection structure is configured to have a predetermined overhang and a predetermined depth by the eave portion and the trench structure.

20 Claims, 8 Drawing Sheets

DISPLAY APPARATUS HAVING SUBSTRATE HOLE

CROSS-REFERENCE TO RELATED APPLICATIONS

This application claims priority to Korean Patent Application No. 10-2019-0142380 filed on Nov. 8, 2019, in the Korean Intellectual Property Office, the disclosure of which is expressly incorporated by reference into the present application.

BACKGROUND

Field

The present disclosure relates to a display apparatus, and more particularly, to a display apparatus including a pixel area with a substrate hole.

Description of the Related Art

An image display apparatus which implements various information on a screen is a core technology in an information communication era, and is developing to be thinner, lighter, and portable to provide better performance. Therefore, a flat panel display apparatus with a reduced weight and a reduced volume, which are the advantages over a cathode ray tube (CRT), is in the spotlight and desired.

Examples of the flat panel display apparatus include a liquid crystal display (LCD), a plasma display panel (PDP), an electroluminescence emitting display (ELD), and a micro-LED display (μLED).

The flat panel display apparatus is used not only for various types of devices such as a TV, a monitor, and a portable phone, but also is being developed by adding a camera, a speaker, and a sensor. However, the camera, the speaker, and the sensor are disposed in a non-pixel area located at an outer periphery of the pixel area so that the display apparatus of the related art can have a limitation in that the non-pixel area can be increased and the pixel area can be reduced.

SUMMARY

Inventors of the present disclosure tried to create a substrate hole through which a camera can photograph images, in the pixel area, thereby reducing a non-pixel area. However, the inventors of the present specification recognized that moisture permeated pixels in the vicinity of the substrate hole, due to the substrate hole, which caused defects. Therefore, the inventors of the present disclosure have studied a disconnection structure of an organic light emitting diode which blocks a moisture permeation path through the organic light emitting diode formed on an entire pixel area. Further, the inventors also have studied a structure which reduces a disconnected area between the substrate hole and the pixel area by the disconnection structure.

Therefore, the present disclosure has been made to solve or address the above-described problems and limitations and an object is to provide an improved display apparatus including a disconnection structure which can reduce a disconnected area.

According to an aspect of the present disclosure, the display apparatus includes a substrate including a pixel area including a disconnected area which encloses a hole area, an organic light emitting diode in the pixel area and the disconnected area, a plurality of inorganic insulating layers disposed below the organic light emitting diode, a disconnection structure which is disposed in the disconnected area and encloses the hole area, and an internal dam which is disposed in the disconnected area and encloses the disconnection structure, and in which the disconnection structure includes an eave portion which is simultaneously patterned with the internal dam and a trench which is patterned by etching the plurality of inorganic insulating layers disposed below the eave portion, and the disconnection structure is configured to have a predetermined overhang and a predetermined depth by the eave portion and the trench structure.

According to the present disclosure, a substrate hole in which the camera module is disposed is disposed in the pixel area so that a dimension of the non-pixel area can be reduced.

Further, according to the present disclosure, the disconnection structure forms an eave portion and a trench so that the organic light emitting diode is disconnected. Accordingly, the disconnection structure can block or delay moisture or oxygen which can permeate through the organic light emitting diode from flowing into the pixel area.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
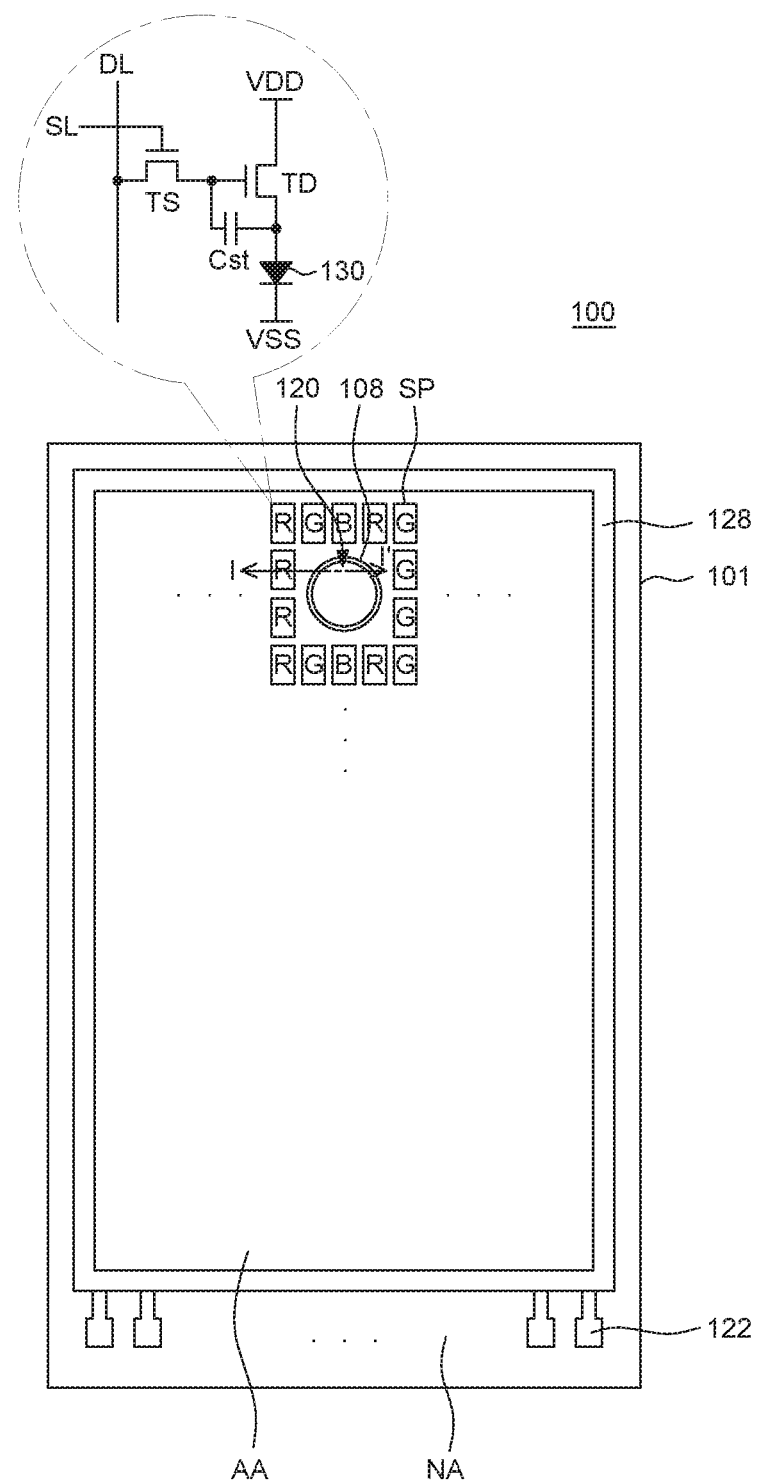
FIG. 1 is a view illustrating a display apparatus according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and may not define any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of the display device according to all embodiments of the present disclosure are operatively coupled and configured.

Figure 2:
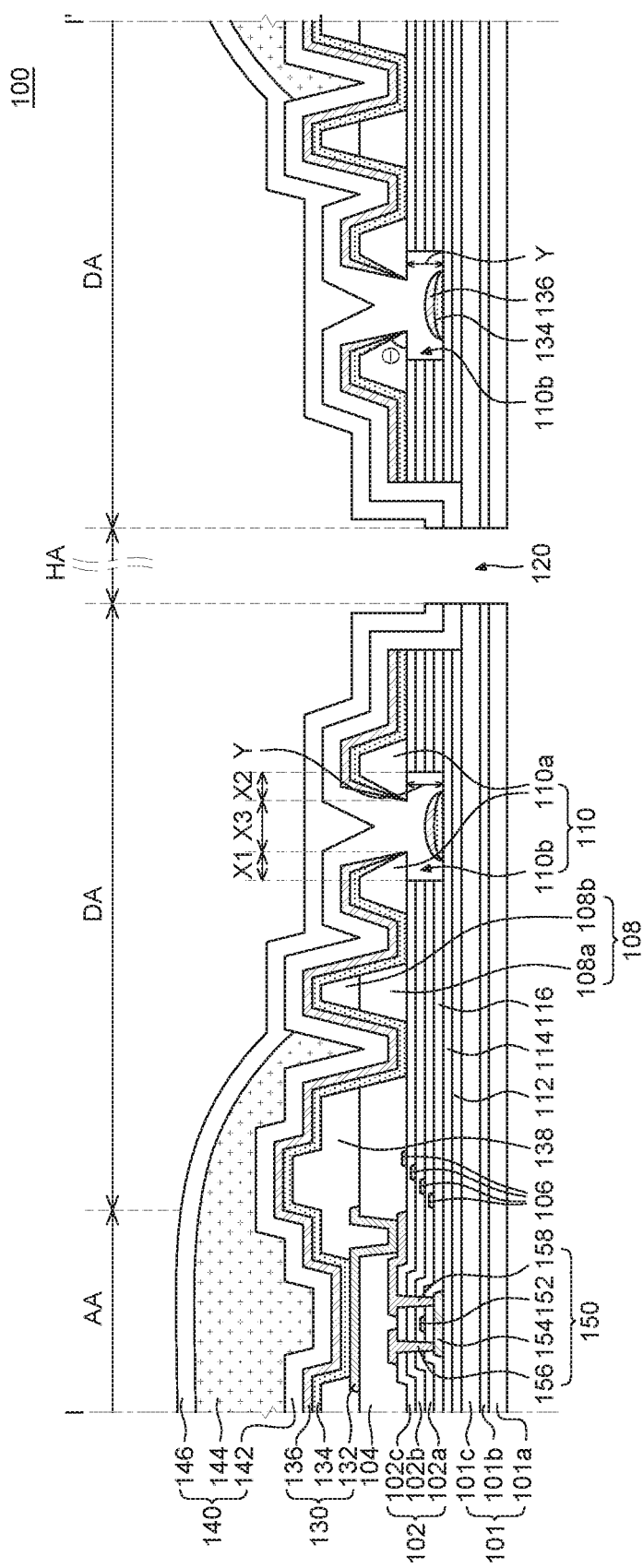
FIG. 2 is a cross-sectional view of the display apparatus taken along line I-I' of FIG. 1.

FIG. 1 is a view illustrating a display apparatus 100 according to an embodiment of the present disclosure, and FIG. 2 is a cross-sectional view of the display apparatus taken along line I-I' of FIG. 1.

The display apparatus 100 according to the exemplary embodiment of the present disclosure will be described with reference to FIGS. 1 and 2.

The display apparatus 100 illustrated in FIGS. 1 and 2 includes a pixel area AA for displaying images and a non-pixel area NA for not displaying images.

In the non-pixel area NA, a plurality of pads 122 which supplies a driving signal to a plurality of signal lines 106 disposed in the pixel area AA is formed. Here, the signal lines 106 can include at least one of a scan line SL, a data line DL, a high-potential voltage VDD supply line and a low-potential voltage VSS supply line.

The pixel area AA can further include a disconnected area DA and a hole area HA.

Since the hole area HA is disposed in the pixel area AA, the hole area HA can be enclosed by a plurality of sub pixels SP disposed in the pixel area AA. The hole area HA is illustrated to have a circular shape but is not limited thereto and can be formed to have a polygonal or an elliptical shape. For example, the shape of the hole area HA can be determined depending on a shape of a corresponding sensor module.

In an example, each sub pixel SP is configured to include a light emitting diode 130. The sub pixel SP can include a light emitting diode 130 and a pixel driving circuit which independently drives the light emitting diode 130. Hereinafter, an organic light emitting diode will be described as an example of the light emitting diode 130.

The pixel driving circuit can include a switching transistor TS, a driving transistor TD, and a storage capacitor Cst.

When a scan pulse is supplied to the scan line SL, the switching transistor TS is turned on to supply a data signal, which is supplied to the data line DL, to the storage capacitor Cst and a gate electrode of the driving transistor TD.

The driving transistor TD controls a current supplied from the high-potential voltage VDD supply line to the light emitting diode 130 in response to the data signal supplied to the gate electrode of the driving transistor TD to control a luminance of the light emitting diode 130. However, even though the switching transistor TS is turned off, the driving transistor TD supplies a current by a voltage charged in the storage capacitor Cst so that the light emitting diode 130 can maintain an emission state.

As illustrated in FIG. 2, the transistor 150 includes an active layer 154 disposed on an active buffer layer 114, a gate electrode 152 overlapping the active layer 154 with a gate insulating layer 116 therebetween, and a source electrode 156 and a drain electrode 158. The source electrode 156 and the drain electrode 158 are formed on a multilayered interlayer insulating layer 102 to be in contact with the active layer 154. However, the transistor 150 is not limited thereto and the active buffer layer 114 can be omitted if necessary.

The active layer 154 can be formed of at least any one of an amorphous semiconductor material, a polycrystalline semiconductor material, and an oxide semiconductor material. The active layer 154 can include a channel region, a source region, and a drain region. The channel region overlaps the gate electrode 152 with the gate insulating layer 116 therebetween to form a channel region between the source electrode 156 and the drain electrode 158. The source region of the active layer 154 is electrically connected to the source electrode 156 through a contact hole which passes through the gate insulating layer 116 and a multilayered interlayer insulating layer 102. The drain region of the active layer 154 is electrically connected to the drain electrode 158 through a contact hole which passes through the gate insulating layer 116 and the multilayered interlayer insulating layer 102.

A multi buffer layer 112 is included between the active layer 154 and the substrate 101. The multi buffer layer 112 delays the diffusion of moisture and/or oxygen which permeates the substrate 101. The active buffer layer 114 which can be disposed on the multi buffer layer 112 protects the active layer 154 and blocks various types of defects introduced from the substrate 101. The substrate 101 can be, for example, formed of a first polyimide substrate 101a, a substrate insulating layer 101b, and a second polyimide substrate 101c, but is not limited thereto. The active buffer layer 114 and the gate insulating layer 116 can be formed of SiOx to suppress the diffusion of hydrogen to the active layer but is not limited thereto.

At least one of the multi buffer layer 112, the active buffer layer 114, and the substrate 101 can be formed with a multilayered structure. The active buffer layer 114, the multi buffer layer 112, the gate insulating layer 116, and the multilayered interlayer insulating layer 102 can be formed of inorganic insulating layers having an excellent moisture blocking performance. For example, the gate insulating layer 116, the active buffer layer 114, the multi buffer layer 112, and the multilayered interlayer insulating layer 102 can be formed of any one of SiNx and SiOx.

A plurality of signal lines 106 can be formed of a metal layer which is the same as a metal layer which forms the transistor 150 and the storage capacitor Cst. The plurality of signal lines 106 is provided on the gate insulating layer 116 and the multilayered interlayer insulating layer 102 so that it is possible to design a high resolution panel and form a storage capacitor Cst.

The multilayered interlayer insulating layer 102 can include a first interlayer insulating layer 102a, a second interlayer insulating layer 102b, and a third interlayer insulating layer 102c, but it is not limited thereto. The number of interlayer insulating layers 102 can vary to be two layers or four or more layers depending on the panel design.

The plurality of signal lines 106 can be formed to have a single layer or a multi-layered structure including Al, Ag, Cu, Pb, Mo, Ti, or an alloy thereof.

The light emitting diode 130 includes an anode electrode 132 connected to the drain electrode 158 of the transistor 150, at least one organic light emitting diode 134 formed on the anode electrode 132, and a cathode electrode 136 formed on the organic light emitting diode 134 so as to be connected to the low-voltage VSS supply line. Here, the low-voltage VSS supply line supplies a low-voltage VSS which is relatively lower than a high voltage VDD.

The anode electrode 132 is electrically connected to the drain electrode 158 of the transistor 150 which is exposed through a pixel contact hole which passes through the over coating layer 104 disposed on the transistor 150. Here, the transistor 150 can be a driving transistor TD. The anode electrode 132 of each sub pixel SP is disposed on the over coating layer 104 so as to be exposed by a bank-spacer layer 138. The over coating layer 104 can be referred to as a planarization layer. The bank-spacer layer 138 can refer to a layer configured to perform a function of a bank and/or a spacer and is formed such that a height difference between the bank and the spacer is generated by a half-tone exposure process but is not limited thereto.

When the anode electrode 132 is applied to a bottom emission type electroluminescent emitting display apparatus, the anode electrode 132 is formed of a transparent conductive film such as indium-tin-oxide ITO or indium-zinc-oxide IZO. Further, when the anode electrode 132 is applied to a top emission type electroluminescent emitting display apparatus, the anode electrode 132 is formed with a multilayered structure including a transparent conductive film and an opaque conductive film having a high reflection efficiency. The transparent conductive film is formed of a material having a relatively high work function, such as indium-tin-oxide ITO or indium-zinc-oxide IZO and the opaque conductive film is formed with a single or multilayered structure including Al, Ag, Cu, Pb, Mo, Ti, or an alloy thereof. For example, the anode electrode 132 can be formed to have a structure in which a transparent conductive layer, an opaque conductive layer, and a transparent conductive layer are sequentially laminated.

The organic light emitting diode 134 can be formed such that a hole transport layer, a light emitting layer, and an electron transport layer are laminated on the anode electrode 132 in this order or a reverse order. The organic light emitting diode 134 can include a common layer formed on the entire pixel area AA and a light emitting layer which is patterned only on the anode electrode 132 to express a color of a specific sub pixel SP.

The cathode electrode 136 is formed on an upper surface and a side surface of the organic light emitting diode 134 and the bank-spacer layer 138 so as to be opposite to the anode electrode 132 with the organic light emitting diode 134 therebetween.

The encapsulation unit 140 blocks moisture or oxygen from being permeated into the light emitting diode 130 which is vulnerable to the moisture or oxygen from the outside. To this end, the encapsulation unit 140 includes a plurality of inorganic encapsulation layers 142 and 146 and a foreign material compensation layer 144 disposed between the plurality of inorganic encapsulation layers 142 and 146 and the inorganic encapsulation layer 146 is disposed on a top layer. For example, the encapsulation unit 140 can be configured to include at least one inorganic encapsulation layer and at least one foreign material compensation layer. In the present specification, a structure of the encapsulation unit 140 in which the foreign material compensation layer 144 is disposed between the first and second inorganic encapsulation layers 142 and 146 will be described as an example, but it is not limited thereto.

The first inorganic encapsulation layer 142 is formed on the cathode electrode 136. The first inorganic encapsulation layer 142 is formed of an inorganic encapsulation material on which low-temperature deposition is allowed, such as silicon nitride SiNx, silicon oxide SiOx, silicon oxynitride SiON, or aluminum oxide $Al_2O_3$. Therefore, since the first inorganic encapsulation layer 142 is deposited under a low-temperature atmosphere, the organic light emitting diode 134 which is vulnerable to a high-temperature atmosphere can be protected during a deposition process of the first inorganic encapsulation layer 142.

The second inorganic encapsulation layer 146 is formed to cover an upper surface and a side surface of the foreign material compensation layer 144 and a top surface of the first inorganic encapsulation layer 142 which is exposed by the foreign material compensation layer 144. The top surface, the bottom surface, and the side surface of the foreign material compensation layer 144 are sealed by the first and second inorganic encapsulation layers 142 and 146. Therefore, the permeation of the moisture or oxygen from the outside into the foreign material compensation layer 144 or the permeation of the moisture or oxygen in the foreign material compensation layer 144 into the light emitting diode 130 is minimized or blocked. The second inorganic encapsulation layer 146 is formed of an inorganic insulating material, such as silicon nitride SiNx, silicon oxide SiOx, silicon oxynitride SiON, or aluminum oxide $Al_2O_3$.

The foreign material compensation layer 144 serves as a buffer for alleviating a stress between layers caused when the electroluminescent emitting display apparatus is bent and enhances a planarization performance. Further, the foreign material compensation layer 144 is formed to have a larger thickness than that of the inorganic encapsulation layers 142 and 146 to suppress cracks from being caused by the foreign material. The foreign material compensation layer 144 is formed of an organic insulating material, such as acrylic resin, epoxy resin, polyimide, polyethylene, or silicon oxy carbon SiOC.

When the foreign material compensation layer 144 is formed, an external dam 128 and an internal dam 108 are formed to restrict mobility of the foreign material compensation layer 144.

At least one external dam 128 is formed so as to completely enclose the pixel area AA in which sub pixels SP are disposed, as illustrated in FIG. 1, or formed between the pixel area AA and the non-pixel area NA. When the non-pixel area NA in which the plurality of pads 122 is disposed is disposed at one side of the substrate 101, the external dam 128 can be disposed only at one side of the substrate 101. When the non-pixel area NA in which the plurality of pads 122 is disposed is disposed at both sides of the substrate 101, the external dam 128 can be disposed at both sides of the substrate 101. When a plurality of external dams 128 is disposed, the external dams 128 are disposed to be spaced apart from each other with a predetermined interval. Therefore, when the foreign material compensation layer 144 overflows one external dam 128, another external dam 128 which is spaced apart therefrom can additionally block the overflowing foreign material compensation layer 144. Various structures of the external dams 128 described above can block the foreign material compensation layer 144 from being spread to the non-pixel area NA.

At least one internal dam 108 is disposed so as to completely enclose the substrate hole 120 disposed in the hole area HA. In this case, a plurality of internal dams 108 is disposed, the internal dams 108 are disposed to be spaced apart from each other with a predetermined interval. Similarly, to the external dam 128, the internal dam 108 can be formed with a single or multilayered structure 108a and 108b. For example, each of the internal dam 108 and the external dam 128 is formed of the same material as at least one of the over coating layer 104 and the bank-spacer layer 138, simultaneously, so that a mask adding process and cost increase can be avoided. The internal dam 108 can suppress the spreading of the foreign material compensation layer 144, which can be used as a moisture permeation path, into the hole area HA. Here, the organic light emitting diode 134 is disposed on the internal dam 108. The reason is that when the pixel area AA is formed, the organic light emitting diode 134 is deposited on the entire pixel area AA. In contrast, the organic light emitting diode 134 is removed from the top surface of the external dam 128.

Since the organic light emitting diode 134 is significantly vulnerable to moisture permeation, a moisture permeation path from the hole area HA to the pixel area AA is formed by the substrate hole 120 so that the moisture can be transmitted to the light emitting diode 130, which can cause defects.

The disconnected area DA is disposed between the hole area HA and the pixel area AA. In other words, the disconnected area DA is configured so as to enclose an outer side of the hole area HA. In the disconnected area DA, the internal dam 108 and at least one disconnection structure 110 can be disposed.

The disconnection structure 110 is disposed between the internal dam 108 and the substrate hole 120. In other words, the disconnection structure 110 is configured so as to enclose an outer side of the hole area HA. The disconnection structure 110 is configured to include an eave portion 110a and a trench 110b.

The eave portion 110a is formed of the same material as at least one of the over coating layer 104 and the bank-spacer layer 138 and simultaneously formed when the over coating layer 104 and the bank-spacer layer 138 are formed. In other words, the eave portion 110a can be simultaneously formed when the internal dam 108 is formed so that the mask adding process and the cost increase can be avoided. The eave portion 110a is configured to have an overhang which protrudes above the trench 110b. The eave portion 110a can be disposed on at least one side surface of the trench 110b. For example, the eave portion 110a can be disposed above the trench 110b adjacent to the hole area HA. For example, the eave portion 110a can be disposed above the trench 110b adjacent to the pixel area AA. For example, the eave portion 110a can be disposed at both sides above the trench 110b adjacent to the pixel area AA and the hole area HA, to be spaced apart from each other. Referring to FIG. 2, an exemplary embodiment in which the eave trench 110b of the disconnection structure 110 are disposed at both sides of the trench 110b is illustrated, but it is not limited thereto. The eave portion 110a which overlaps the trench 110b is configured to have a predetermined taper angle θ. For example, the taper angle θ can be 10° to 90° but is not limited thereto.

The trench 110b is disposed below the eave portion 110a. For example, the trench 110b can be formed under the eave portion 110a. The trench 110b is formed by etching at least one of the multi buffer layer 112, the active buffer layer 114, the gate insulating layer 116, and the multilayered interlayer insulating layer 102 disposed between the substrate 101 and the over coating layer 104.

The trench 110b is formed after forming the eave portion 110a and is formed before forming the organic light emitting diode 134. According to the above-described configuration, the organic light emitting diode 134 and/or the cathode electrode 136 can be disconnected by the eave portion 110a and the trench 110b.

To be more specific, when the organic light emitting diode 134 and the cathode electrode 136 are formed, the organic light emitting diode 134 and the cathode electrode 136 can be disconnected by the disconnection structure 110 including the eave portion 110a having an overhang and the trench 110b, without having continuity.

Referring to FIG. 2, the organic light emitting diode 134 and the cathode electrode 136 which are disconnected in the trench 110b are illustrated. Accordingly, even though the moisture permeates along the organic light emitting diode 134 disposed to be adjacent to the hole area HA from the outside, the permeation of the moisture into the pixel area AA can be blocked or delayed by the disconnection structure 110. Further, even though static electricity is introduced along the cathode electrode 136 disposed to be adjacent to the hole area HA, the diffusion of the static electricity into the pixel area AA can be blocked by the disconnection structure 110.

For example, overhangs of the eave portions 110a protruding from the trench 110b are configured to have predetermined widths X1 and X2. The widths X1 and X2 of the over hangs can protrude from the side surface of the trench 110b by approximately 0.1 µm. If the widths X1 and X2 of the overhangs of the eave trench 110a protrude less than 0.1 µm from the side surface of the trench 110b, when the organic light emitting diode 134 and the cathode electrode 136 are formed, the organic light emitting diode 134 and the cathode electrode 136 may not be completely disconnected. Therefore, problems such as moisture permeation or static electricity generation can be caused in the pixel area AA along the organic light emitting diode 134.

For example, a distance X3 between an internal eave portion and an external eave portion can be 0.1 µm or more. If the distance X3 between the internal eave portion and the external eave portion is less than 0.1 µm, when the organic light emitting diode 134 and the cathode electrode 136 are formed, the organic light emitting diode 134 and the cathode electrode 136 may not be completely disconnected. Therefore, problems such as moisture permeation or static electricity generation can be caused in the pixel area AA along the organic light emitting diode 134.

For example, the trench 110b can be configured to have a predetermined depth Y. The depth of the trench 110b can be at least 0.1 μm. If the depth Y of the trench 110b is less than 0.1 μm, the organic light emitting diode 134 and the cathode electrode 136 may not be completely disconnected. Therefore, problems such as moisture permeation or static electricity generation can be caused in the pixel area AA along the organic light emitting diode 134.

For example, the width of the trench 110b can be a sum of the widths X1 and X2 of the overhangs of the eave portions 110a and the distance X3 between the eave portions 110a, but it is not limited thereto.

For example, the width X1 of the overhang of the external eave portion and the width X2 of the overhang of the internal eave portion can be equal to each other or different from each other.

In addition, whether the organic light emitting diode 134 is disconnected is more important than whether the cathode electrode 136 is disconnected so that the disconnection structure 110 needs to be designed to prioritize whether the organic light emitting diode 134 is disconnected.

The inside of the trench 110b is configured to be sealed by the inorganic encapsulation layer. Referring to FIG. 2, the cathode electrode 136 which is disconnected from the organic light emitting diode 134 is disposed in the trench 110b. The remaining area in the trench 110b is sealed by the first inorganic encapsulation layer 142 so that the moisture permeation can be blocked.

The substrate hole 120 is formed to pass through the substrate 101 and a plurality of inorganic insulating layers on the substrate 101. For example, the substrate hole 120 is formed to pass through the hole area HA, inorganic insulating layers 112, 114, 116, and 102 in the vicinity of the hole area HA, the organic light emitting diode 134, the cathode electrode 136, and the inorganic encapsulation layers 142 and 146 to expose an upper surface of the substrate 101.

A display apparatus 200 according to another exemplary embodiment of the present disclosure will be described with reference to FIG. 3.

Figure 3:
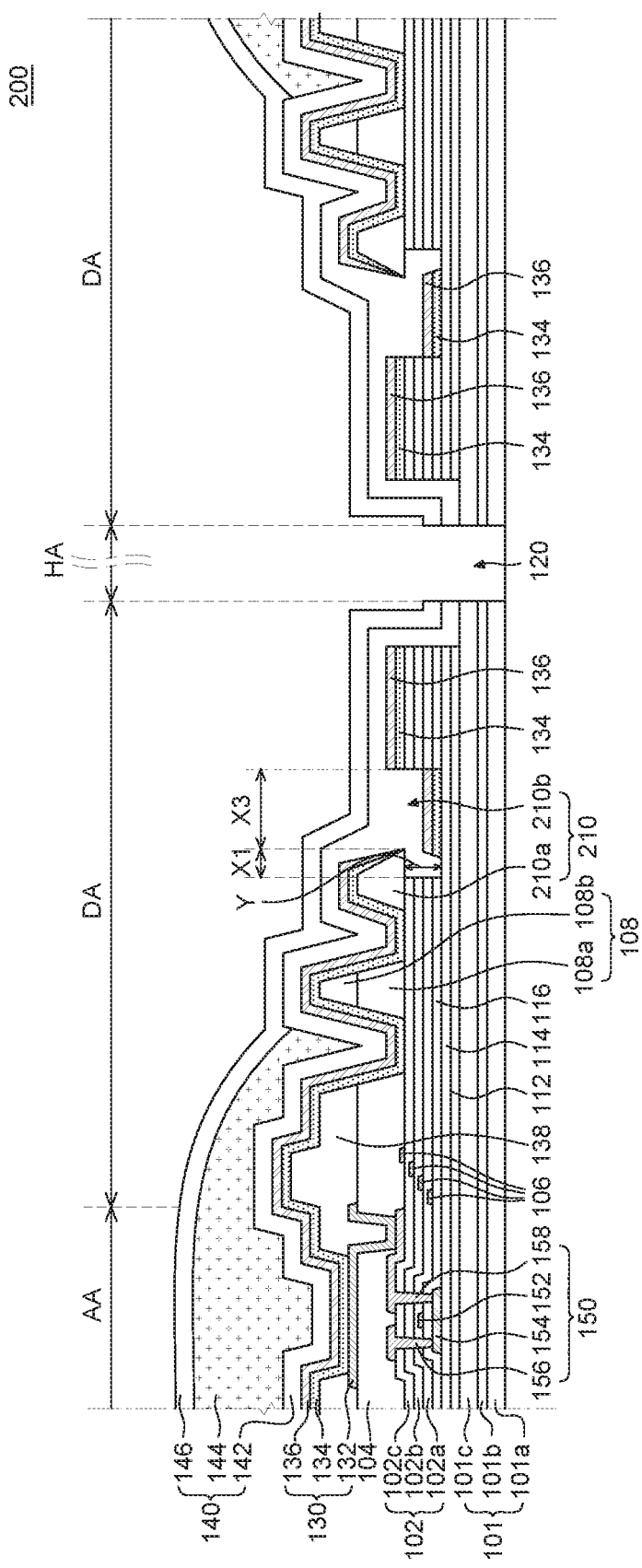
FIG. 3 is a cross-sectional view of a display apparatus according to another embodiment of the present disclosure.

Referring to FIG. 3, the display apparatus 200 according to another exemplary embodiment of the present disclosure is substantially the same as the display apparatus 100 according to the exemplary embodiment of the present disclosure except for the disconnection structure 210. Therefore, for the convenience of description, a redundant description will be brief or omitted below.

The display apparatus 200 according to another exemplary embodiment of the present disclosure is configured to include a disconnection structure 210. The disconnection structure 210 is configured to include an eave portion 210a and a trench 210b.

The eave portion 210a can be disposed one side surface of the trench 210b. In FIG. 3, even though the eave portion 210a is disposed at the outside of the trench 210b as an example, the eave portion can be disposed in the trench 210b. The inside of the trench 210b is configured to be sealed by the inorganic encapsulation layer. The disconnected organic light emitting diode 134 and the disconnected cathode electrode 136 are disposed in the trench 210b. If a distance X3 of the disconnection structure 210 according to another exemplary embodiment of the present disclosures is the same as the distance X3 of the disconnection structure 110 according to the exemplary embodiment of the present disclosure, the eave portion 210a can be formed only on one side surface. Therefore, the width of the disconnection structure 210 can be further relatively reduced. Accordingly, the width of the disconnected area DA is reduced.

A display apparatus 300 according to still another exemplary embodiment of the present disclosure will be described with reference to FIG. 4.

Figure 4:
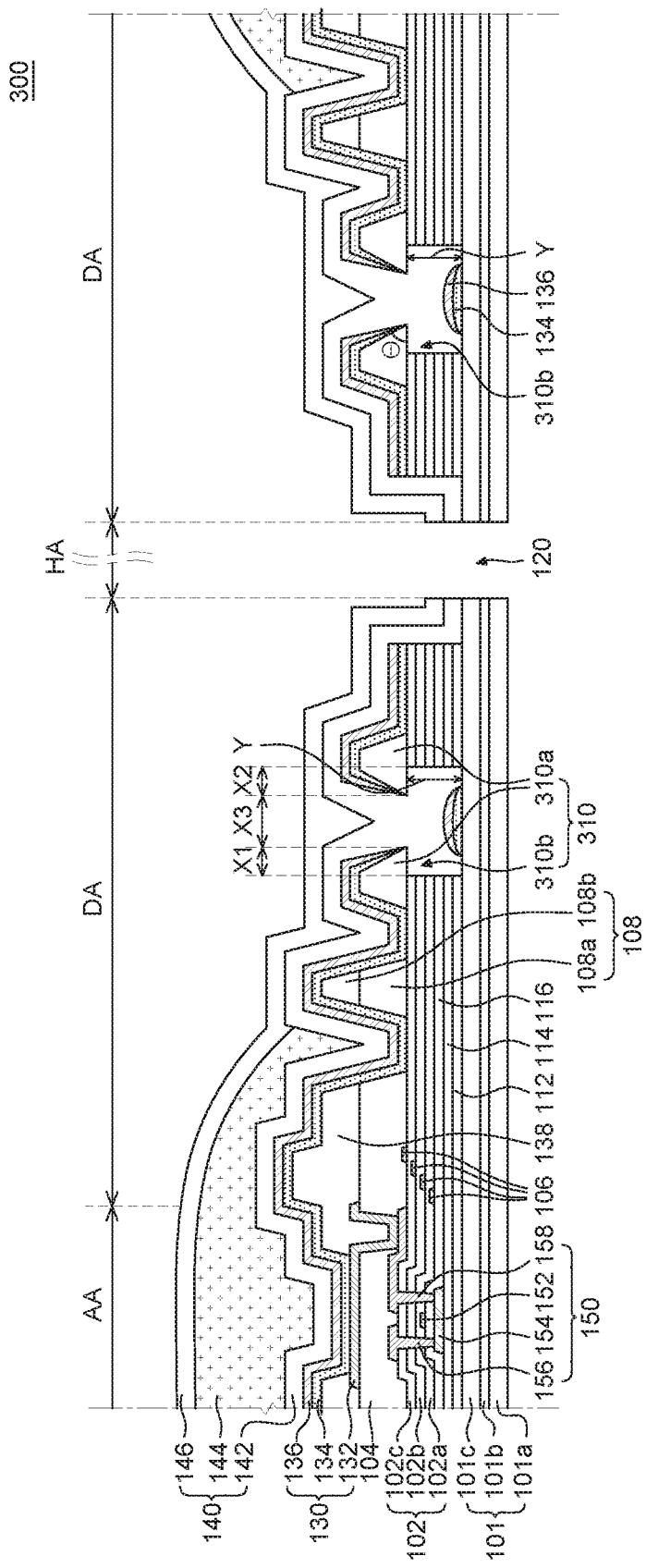
FIG. 4 is a cross-sectional view of a display apparatus according to still another embodiment of the present disclosure.

Referring to FIG. 4, the display apparatus 300 according to still another exemplary embodiment of the present disclosure is substantially the same as the display apparatus 100 according to the exemplary embodiment of the present disclosure except for the disconnection structure 310. Therefore, for the convenience of description, a redundant description will be brief or omitted below.

The display apparatus 300 according to still another exemplary embodiment of the present disclosure is configured to include a disconnection structure 310. The disconnection structure 310 is configured to include an eave portion 310a and a trench 310b.

The trench 310b is formed by etching all the multi buffer layer 112, the active buffer layer 114, the gate insulating layer 116, and the multilayered interlayer insulating layer 102 disposed between the substrate 101 and the over coating layer 104. For example, the trench 310b of the disconnection structure 310 can be formed by etching to expose the top surface of the substrate 101. According to the above-described structure, the depth Y of the trench 310b can be formed to be deeper. Specifically, as the depth Y of the trench 310b according to still another exemplary embodiment of the present disclosure is increased, the organic light emitting diode 134 and the cathode electrode 136 can be more easily disconnected, than the trench 110b according to the exemplary embodiment of the present disclosure. Further, the multi buffer layer 112, the active buffer layer 114, the gate insulating layer 116, and the multilayered interlayer insulating layer 102 are the inorganic insulating layers so that the trench 310b can be formed by the same etching process. To be more specific, an additional process can be required to etch a second polyimide substrate 101c. However, the trench 310b can be formed by the single etching process from the multilayered interlayer insulating layer 102 to the multi buffer layer 112.

A display apparatus 400 according to still another exemplary embodiment of the present disclosure will be described with reference to FIG. 5.

Figure 5:
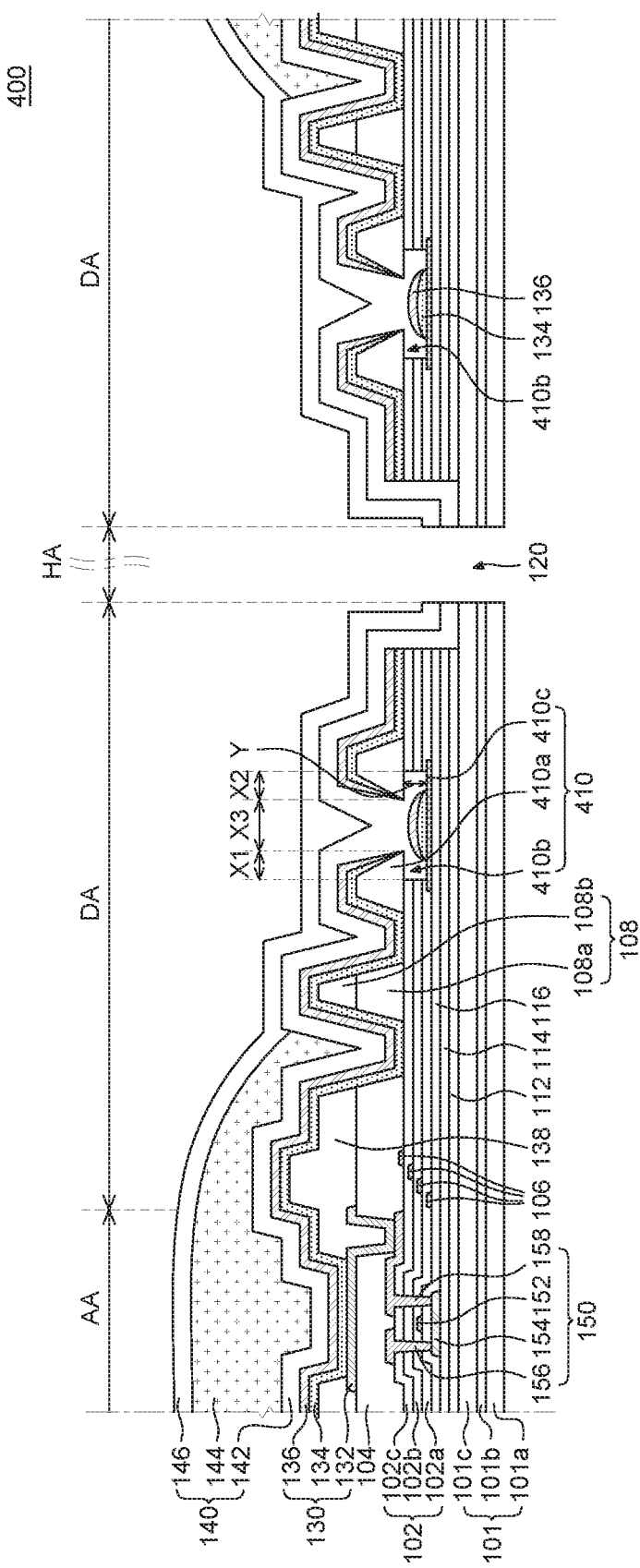
FIG. 5 is a cross-sectional view of a display apparatus according to still another embodiment of the present disclosure.

Referring to FIG. 5, the display apparatus 400 according to still another exemplary embodiment of the present disclosure is substantially the same as the display apparatus 100 according to the exemplary embodiment of the present disclosure except for the disconnection structure 410. Therefore, for the convenience of description, a redundant description will be brief or omitted below.

The display apparatus 400 according to still another exemplary embodiment of the present disclosure is configured to include a disconnection structure 410. The disconnection structure 410 is configured to include an eave portion 410a and a trench 410b. The disconnection structure 410 further includes an etch stopper 410c.

The etch stopper 410c can be formed of the same metal layer as one of the plurality of signal lines 106.

The etch stopper 410c can be selected in accordance with a required depth Y of the trench 410b. Referring to FIG. 5, a plurality of signal lines 106 is disposed on a plurality of inorganic insulating layers. Here, in order to adjust a depth Y of the trench 410b, an upper signal line can be used as an etch stopper or a lower signal line can be used as an etch stopper. The etch stopper 410c is formed along the eave portion 410a and the trench 410b. For example, when the shapes of the eave portion 410a and the trench 410b are circular in plan view, the etch stopper 410c is also formed to have a circular shape. A width of a cross-section of the etch stopper 410c is formed to be larger than a width of a cross-section of the trench 410b. For example, the width of the cross-section of the etch stopper 410c can be larger than a sum of widths X1 and X2 of overhangs of the eave portions and a distance X3 between the eave portions 410a. Further, the etch stopper 410c is formed to further outwardly protrude from the trench 410b. According to the above-described configuration, the etch stopper 410c can easily adjust the depth Y of the trench 410b and no addition process is necessary.

A display apparatus 500 according to still another exemplary embodiment of the present disclosure will be described with reference to FIG. 6.

Figure 6:
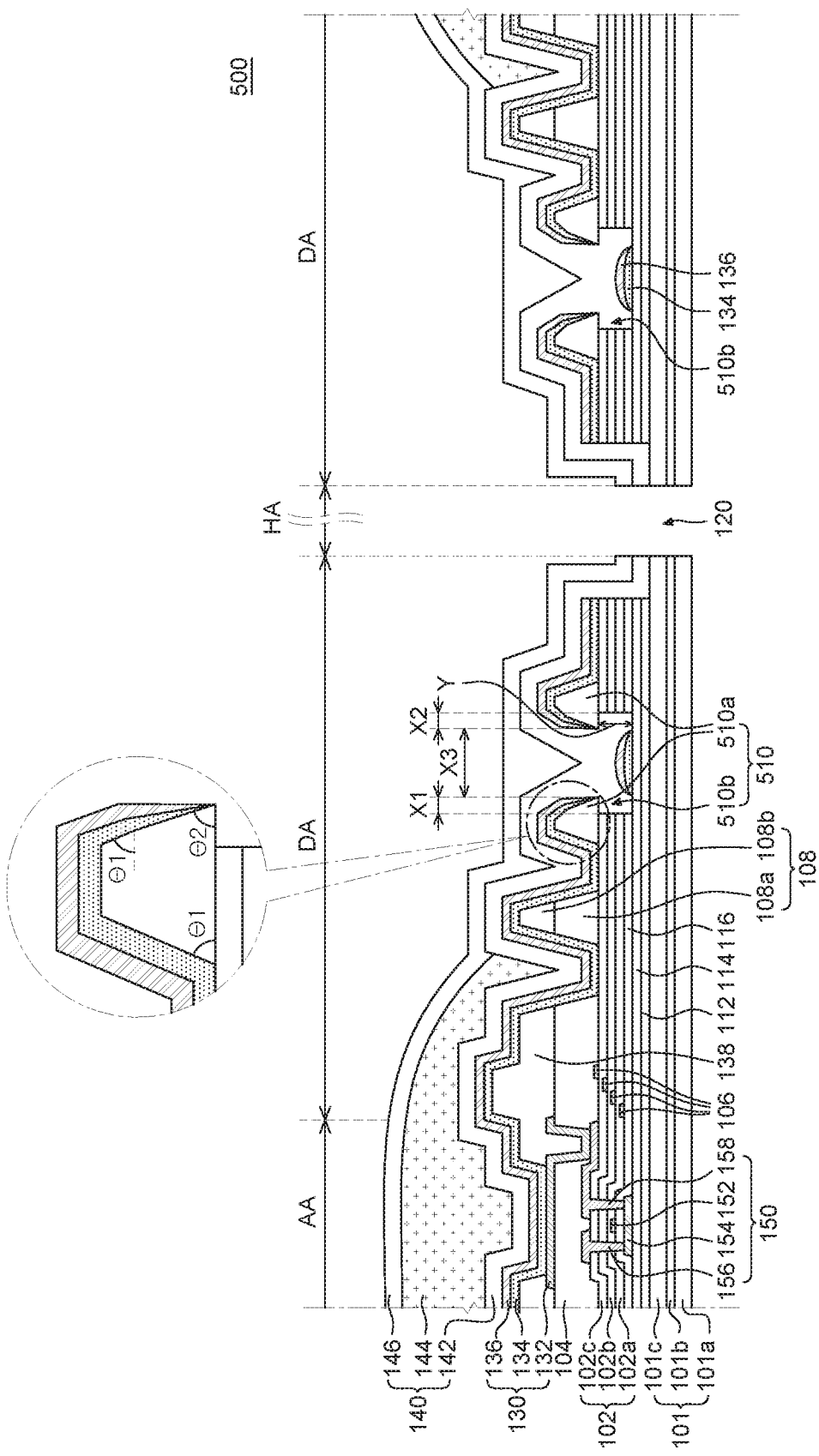
FIG. 6 is a cross-sectional view of a display apparatus according to still another embodiment of the present disclosure.

Referring to FIG. 6, the display apparatus 500 according to still another exemplary embodiment of the present disclosure is substantially the same as the display apparatus 100 according to the exemplary embodiment of the present disclosure except for the disconnection structure 510. Therefore, for the convenience of description, a redundant description will be brief or omitted below.

The display apparatus 500 according to still another exemplary embodiment of the present disclosure is configured to include a disconnection structure 510. The disconnection structure 510 is configured to include an eave portion 510a and a trench 510b.

The eave portion 510a is configured to have at least two taper angles of an overhang. Referring to FIG. 6, the eave portion 510a corresponding to the trench 510b is configured to have a first taper angle θ1 and a second taper angle θ2.

The first taper angle θ1 is smaller than a second taper angle θ2. The second taper angle θ2 can be 90° or smaller. According to the above-described configuration, the second taper angle θ2 of the eave portion 510a is larger than the first taper angle θ1 so that a thickness of an end of the eave portion 510a can be increased. Therefore, when the organic light emitting diode 134 and the cathode electrode 136 are formed on the overhang of the eave portion 510a, the organic light emitting diode 134 and the cathode electrode 136 can be more easily disconnected. Further, the larger the thickness of the end of the overhang, the stronger the structure of the eave portion 510a.

A display apparatus 600 according to still another exemplary embodiment of the present disclosure will be described with reference to FIG. 7.

Figure 7:
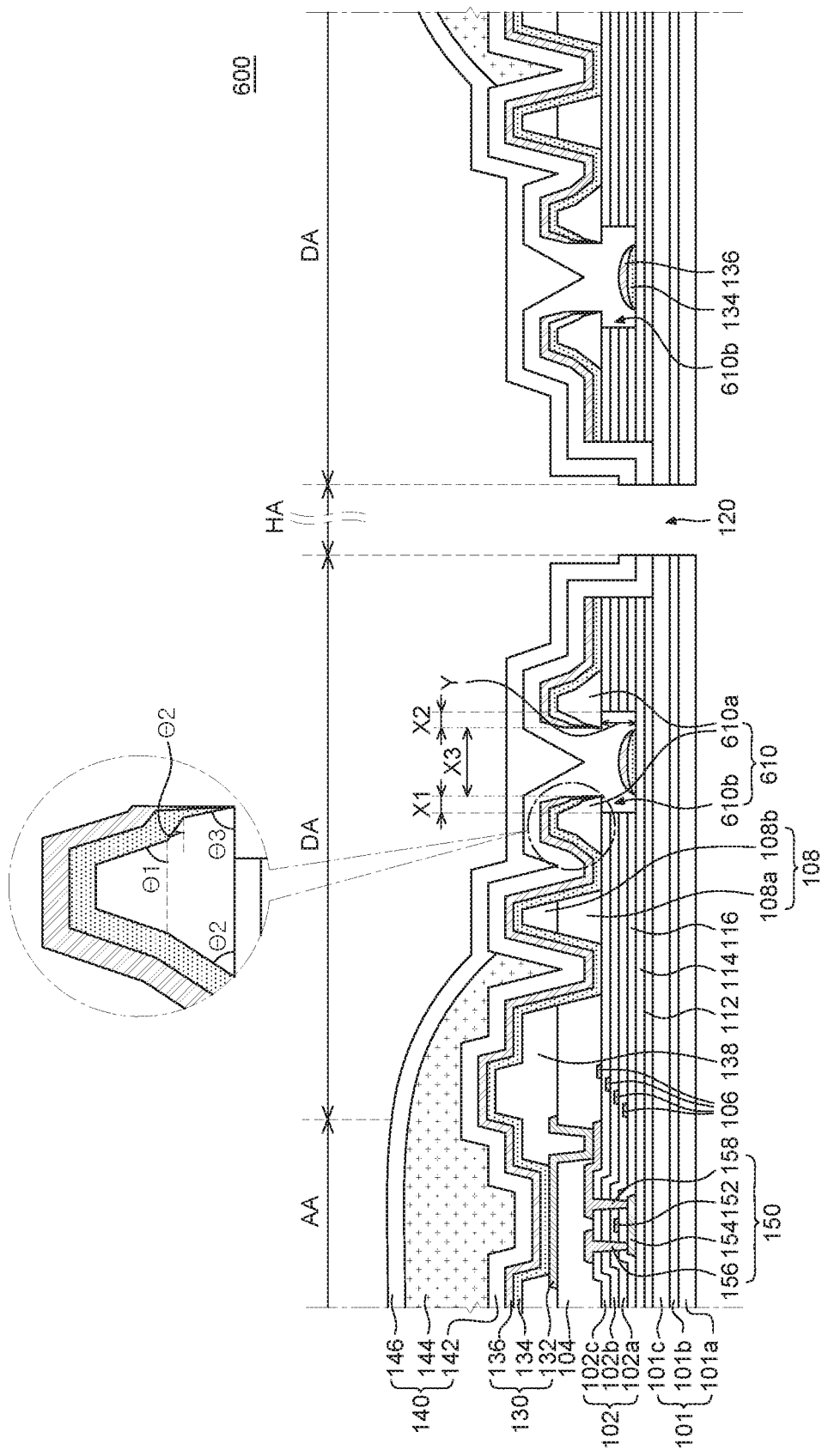
FIG. 7 is a cross-sectional view of a display apparatus according to still another embodiment of the present disclosure.

Referring to FIG. 7, the display apparatus 600 according to still another exemplary embodiment of the present disclosure is substantially the same as the display apparatus 500 according to another exemplary embodiment of the present disclosure except for the disconnection structure 610. Therefore, for the convenience of description, a redundant description will be brief or omitted below.

The display apparatus 600 according to still another exemplary embodiment of the present disclosure is configured to include a disconnection structure 610. The disconnection structure 610 is configured to include an eave portion 610a and a trench 610b.

The eave portion 610a is configured to have at least three taper angles of an overhang. Referring to FIG. 7, the eave portions 610a corresponding to the trench 610b are configured to have a first taper angle θ1, a second taper angle θ2, and a third taper angle θ3.

The first taper angle θ1 is smaller than the third taper angle θ3. The third taper angle θ3 can be 90° or smaller. The second taper angle θ2 is smaller than the first taper angle θ1 and the third taper angle θ3. According to the above-described configuration, the third taper angle θ3 of the eave portion 610a is larger than the first taper angle θ1 so that a thickness of an end of the eave portion 610a can be increased. Further, the second taper angle θ2 is smaller than the first taper angle θ1 and the third taper angle θ3 so that the end of the overhang can protrude while maintaining a relatively large thickness of the end of the overhang. Therefore, when the organic light emitting diode 134 and the cathode electrode 136 are formed on the overhang of the eave portion 610a, the organic light emitting diode 134 and the cathode electrode 136 can be more easily disconnected. Further, the larger the thickness of the end of the overhang, the stronger the structure of the eave portion 610a.

A display apparatus 700 according to still another exemplary embodiment of the present disclosure will be described with reference to FIG. 8.

Figure 8:
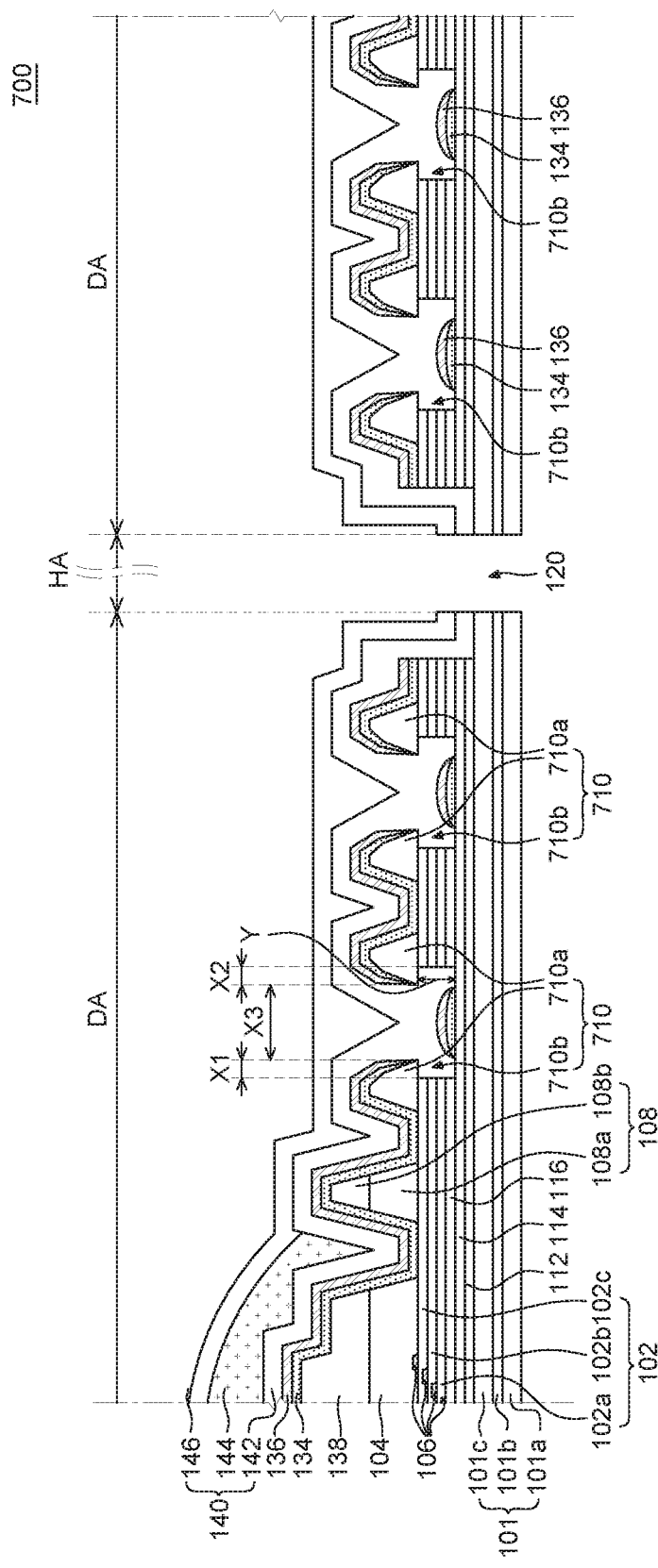
FIG. 8 is a cross-sectional view of a display apparatus according to still another embodiment of the present disclosure.

Referring to FIG. 8, the display apparatus 700 according to still another exemplary embodiment of the present disclosure is substantially the same as the display apparatus 100 according to the exemplary embodiment of the present disclosure except for the number of disconnection structures 710. Therefore, for the convenience of description, a redundant description will be brief or omitted below.

The display apparatus 700 according to still another exemplary embodiment of the present disclosure is configured to include a plurality of disconnection structures 710. The number of the plurality of disconnection structures 710 is at least two, and for example, two to twenty. The plurality of disconnection structures 710 is disposed to be spaced apart from each other and an external disconnection structure 710 is formed to enclose the internal disconnection structure 710. With the above-described configuration, the disconnection performance of the organic light emitting diode 134 can be improved. Further, the disconnection structures 710 can be employed by selectively combining some of disconnection structures according to various exemplary embodiments disclosed in the present disclosure.

In the display apparatus according to various exemplary embodiments of the present disclosure, electronic components including a camera, a speaker, a flash light source, or a biometric sensor such as a fingerprint sensor can be disposed in the hole area. The camera module can include a camera lens and a camera driver. A cover glass can be disposed on the display apparatus according to various exemplary embodiments of the present disclosure. A polarizing plate can be disposed below the cover glass. The camera module is disposed in the pixel area to reduce the non-pixel area of the display apparatus.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
    a substrate including a pixel area and a disconnected area which encloses a hole area;
    an organic light emitting diode in the pixel area;
    a plurality of organic insulating layers disposed below the organic light emitting diode;
    a plurality of inorganic insulating layers disposed below plurality of organic insulating layers;
    a disconnection structure which is disposed in the disconnected area and encloses the hole area; and
    an internal dam which is disposed in the disconnected area and encloses the disconnection structure,
    wherein the disconnection structure includes an eave portion constituting at least one of the plurality of organic insulating layers and a trench which is patterned by etching at least one of the plurality of inorganic insulating layers disposed below the eave portion,
    wherein the disconnection structure is configured to have a predetermined overhang and a predetermined depth by the eave portion and the trench, and
    wherein the eave portion has a mesa shape, a base of the eave portion directly contacts an upper surface of a topmost inorganic insulating layer among the plurality of inorganic insulating layers, and the base of the eave portion is wider than an upper portion of the eave portion.

2. The display apparatus according to claim 1, wherein the predetermined overhang of the disconnection structure is approximately 0.1 µm or larger.

3. The display apparatus according to claim 1, wherein the predetermined depth of the disconnection structure is approximately 0.1 µm or larger.

4. The display apparatus according to claim 1, wherein the organic light emitting diode is disconnected from the trench by the predetermined overhang and the predetermined depth of the disconnection structure.

5. The display apparatus according to claim 1, wherein the plurality of inorganic insulating layers includes at least one of a multilayered interlayer insulating layer, a gate insulating layer, a multi buffer layer, and an active buffer layer, and
    the trench is patterned by etching at least some of the plurality of inorganic insulating layers.

6. The display apparatus according to claim 5, wherein the plurality of inorganic insulating layers includes one of SiNx and SiOx.

7. The display apparatus according to claim 1, wherein the organic light emitting diode is disposed on the internal dam.

8. The display apparatus according to claim 1, wherein the eave portion is configured to have a first taper angle and a second taper angle.

9. The display apparatus according to claim 8, wherein the second taper angle at an end of the overhang is larger than the first taper angle.

10. The display apparatus according to claim 1, further comprising:
    a camera module disposed in the hole area.

11. The display apparatus according to claim 1, further comprising:
    an external dam which is disposed between the pixel area and a non-pixel area so as to enclose the pixel area.

12. The display apparatus according to claim 11, wherein the organic light emitting diode is removed from a top surface of the external dam.

13. The display apparatus according to claim 1, wherein the disconnection structure further includes an etch stopper disposed on the plurality of inorganic insulating layers in the trench.

14. The display apparatus according to claim 13, wherein the etch stopper is made of the same metal layer as one of a plurality of signal lines.

15. The display apparatus according to claim 13, wherein a width of a cross-section of the etch stopper is larger than a width of a cross-section of the trench.

16. The display apparatus according to claim 1, wherein the eave portion is one of two eave portions that are disposed on opposite sides of the trench in the plurality of inorganic insulating layers,
    wherein the two eave portions are spaced apart by a first distance, and
    wherein a depth of the trench the plurality of inorganic insulating layers is greater than or equal to the first distance between the two eave portions.

17. The display apparatus according to claim 1, wherein a cross-section of the eave portion has a trapezoid shape.

18. The display apparatus according to claim 17, wherein the one side of the overhang facing the trench has three different slopes,
    wherein the three different slopes of the one side of the overhang include a first slope, a second slope, and third slope, the first and third slopes having a steeper incline than the second slope, and
    wherein the second slope is disposed between the first slope and the third slope.

19. The display apparatus according to claim 1, wherein the eave portion is configured so that one side of the overhang facing the trench has two different slopes forming an obtuse angle, and a lower portion of the eave portion located below a vertex of the obtuse angle is wider than an upper portion of the eave portion located above the vertex of the obtuse angle.

20. The display apparatus according to claim 1, further comprising:
    an over coating layer disposed between the plurality of organic insulating layers and the plurality of inorganic insulating layers,
    wherein the disconnection structure only includes one or more portions of the over coating layer.

* * * * *